United States Patent
Den et al.

(10) Patent No.: US 6,972,146 B2
(45) Date of Patent: Dec. 6, 2005

(54) STRUCTURE HAVING HOLES AND METHOD FOR PRODUCING THE SAME

(75) Inventors: Tohru Den, Tokyo (JP); Kazuhiko Fukutani, Santa Cruz, CA (US); Nobuhiro Yasui, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/385,570

(22) Filed: Mar. 12, 2003

(65) Prior Publication Data
US 2003/0175472 A1    Sep. 18, 2003

(30) Foreign Application Priority Data
Mar. 15, 2002    (JP) .............................. 2002-073114

(51) Int. Cl.[7] .............................................. B32B 3/24
(52) U.S. Cl. ..................... 428/138; 428/131; 428/137; 428/450; 428/699; 428/701; 205/324; 977/DIG. 1
(58) Field of Search .................. 428/138, 131, 428/137, 450, 699, 701; 205/324; 977/DIG. 1

(56) References Cited

U.S. PATENT DOCUMENTS

| 4,833,000 | A  | * | 5/1989  | Trickett et al. ............. 428/137 |
| 6,045,677 | A  | * | 4/2000  | Beetz et al. .................. 205/50 |
| 6,106,891 | A  | * | 8/2000  | Kulesza et al. ............. 427/97.2 |
| 6,139,713 | A  | * | 10/2000 | Masuda et al. .............. 205/206 |
| 6,610,463 | B1 | * | 8/2003  | Ohkura et al. .............. 430/322 |
| 6,804,081 | B2 | * | 10/2004 | Den et al. ................. 360/97.01 |
| 6,811,853 | B1 | * | 11/2004 | Sherrer et al. .............. 428/138 |
| 2002/0167013 | A1 |  | 11/2002 | Iwasaki et al. ............... 257/79 |
| 2003/0001274 | A1 | * | 1/2003 | Den et al. .................... 257/761 |
| 2004/0033339 | A1 |  | 2/2004 | Fukutani et al. ............. 428/137 |
| 2004/0043208 | A1 |  | 3/2004 | Fukutani et al. ......... 428/304.4 |
| 2004/0048092 | A1 |  | 3/2004 | Yasui et al. ................. 428/642 |
| 2004/0146705 | A1 | * | 7/2004 | Den et al. ................ 428/312.2 |

FOREIGN PATENT DOCUMENTS

| JP | 20-57698      | 2/1990  |
| JP | 7-272651      | 10/1995 |
| JP | 80-78769      | 3/1996  |
| JP | 11-200090     | 7/1999  |
| JP | 2003-25298    | 1/2003  |
| WO | WO 03/069677  | 8/2003  |
| WO | WO 03/078685  | 9/2003  |
| WO | WO 03/078687  | 9/2003  |
| WO | WO 03/078688  | 9/2003  |

OTHER PUBLICATIONS

Matsuda, H., "Solid State Physics", vol. 31, No. 5, 1996: 493-499 (or 57-63).

R.C. Furneaux et al., "The formation of controlled-porosity membranes from anodically oxidiz d aluminum", Nature, vol. 337, No. 6203, pp. 147-149, Jan. 12, 1989.

* cited by examiner

Primary Examiner—William P. Watkins, III
(74) Attorney, Agent, or Firm—Fitzpatrick, Cella, Harper & Scinto

(57) ABSTRACT

A structure having a hole, including a substrate, a first layer including an alumina hole, and a second layer disposed between the substrate and the fist layer, wherein the second layer contains silicon, and has a smaller hole than the alumina hole.

9 Claims, 11 Drawing Sheets

STRUCTURE HAVING HOLES AND METHOD FOR PRODUCING THE SAME

BACKGROUND OF THE INVENTION

1. Field of the Invention

The present invention relates to a structure having holes, and a method for producing the same. In particular, a nano structure made by using a method for anodic oxidizing Al according to the present invention is useful for a wide variety of applications including functional materials and structural materials for electron devices, memory media and memory elements. Specifically, the nano structure is effective for use in vertical magnetic recording media, patterned media, solid magnetic memories, magnetic sensors, and photonic devices.

2. Description of the Related Art

Some thin films, fine lines, and dots of metals and semiconductors that are smaller size than a characteristic length may show specific electric, optical and chemical properties by inhibiting movements of electrons. From such a viewpoint, interests on a material having a microstructure of below 100 nano meter (nm), i.e., nano structure, have been increased.

A method for producing the nano structure include semiconductor processing technologies including a fine pattern drawing technology such as photolithography, electron beam lithography, X-ray lithography and the like.

Other than such production method, there is one approach to provide a novel nano structure based on a naturally formed regular structure, i.e., a self-organized structure. This approach can produce a finer special construction than the conventional one depending on a fineness of the structure used as a base, and therefore many studies have been made.

Examples of the specific self-organized structure include an anodically oxidized alumina film (for example, see C. Furneaux, W. R. Rigby & A. P. Davidson "NATURE" vol. 337, P147 (1989)). An Al plate is anodically oxidized in an acid electrolyte to form a porous oxidized film. This porous oxidized film is characterized by a special geometric structure where highly fine columnar nano holes (microholes) 14 each having a diameter (2r) of several nm to several hundreds nm are arranged in parallel at a space (2R) of several tens of nm to several hundreds nm as shown in FIG. 2A. The columnar nano hole 14 has a high aspect ratio, and has excellent uniformity in a diameter profile. The diameter 2r and the space 2R of the nano hole 14 can be controlled to some degree by adjusting a current and a voltage upon the anodic oxidation. An anodically oxidized alumina film is produced on an Al plate 21 via a barrier layer 22.

A wide variety of applications have been tried by focusing on the special geometric structure of the anodically oxidized alumina nano hole. The details are described by Masuda. For example, the anodically oxidized film is used as a coat utilizing its abrasion resistance and good insulation, or used as a filter by peeling the coat. Furthermore, various applications includes coloring, a magnetic recording medium, an EL light emitting element, an electrochromic element, an optical element, a solar battery and a gas sensor using a technique of filling a metal or a semiconductor into the nano hole, and a technique of replicating the nano hole. In addition, a wide range of applications including quantum effect device such as quantum fine line and MIM element, and a molecular sensor using the nano hole as a chemical reaction site are expected (Masuda, Solid State Physics, 31, 493 (1996)).

The above-mentioned method for producing the nano structure by the semiconductor processing technologies has problems of a poor yield and expensive apparatus. There is a need to provide a simple method for producing the nano structure with good repeatability.

In view of the above, the self-organization method, especially the Al anodic oxidation method, has an advantage that the nano structure can be produced easily and controlled well. Typically, these methods can provide a large area nano structure. However, when an aluminum layer is formed on a substrate, and is anodically oxidized, tightness between hole walls and the substrate may be poor.

FIGS. 2 and 3 show a conceptual sectional views of conventional alumina nano holes on an Al plate (film). FIG. 2A is a sectional view showing an Al plate oxidized on an anode. FIG. 2B is a sectional view showing the Al film on the substrate not completely oxidized on an anode. FIG. 3A is a sectional view showing that the anodic oxidation is terminated with a barrier layer remained. FIG. 3B is a sectional view showing that the barrier layer is removed by dry etching and the like.

The conventional anodically oxidized alumina nano holes are provided only on a surface of the Al plate (film) as shown in FIGS. 2A and 2B, and their applications and forms are thus limited. For example, Al has a melting point of 660° C., and the nano holes formed on the Al cannot be heated at 660° C. or more. In order to use the nano holes as the functional material in various aspects, it is desired to provide a technology for forming the anodically oxidized alumina nano holes on a substrate having a high melting point.

In order to apply the anodically oxidized alumina nano holes to an electronic device and the like, it is desired to provide a technology to embed an enclosing material and to form the enclosing material connectable to the under layer. If the anodically oxidized alumina nano holes can be formed uniformly and stably on the under layer including a good conductive material such as metals, it is possible to form the enclosing material in the anodically oxidized alumina nano holes by controlled electrodeposition, whereby the application can be expected to be broaden.

As an example of forming the anodically oxidized alumina nano holes on the substrate, Japanese Patent Laid-Open No. 7-272651 discloses a technology for "forming an Al film on a Si substrate, altering the Al film to an anodically oxidized film, removing a barrier layer at a bottom of a nano hole part, forming a metal (Au, Pt, Pd, Ni, Ag, Cu) layer capable of forming an eutectic alloy with Si of the Si substrate exposed at the bottom of the nano hole to grow Si needle crystal by a VLS method."

In the technology, the barrier layer at the bottom of the nano hole is removed after the Al film is anodically oxidized, in order to penetrate the nano holes to the Si substrate. As the method for removing the barrier layer, there are cited a method for etching with chromic acid-based etching liquid, and a method for connecting the Si substrate and a counter electrode with an external wire after the anodic oxidation is completed, and for holding the structure in the liquid.

Through intense studies by the present inventors, it is found that after the Al film is oxidized on the anode across a total film thickness and the barrier layer remains as shown in FIG. 3A, it is very difficult to complete the anodic oxidation with good repeatability.

Especially when the under layer is disposed under the Al film, and the substrate as the under layer or the under layer are made of a low reactive material, and the anodic oxidation proceeds in the state shown in FIG. 3A, the barrier layer is deteriorated or lost in a very short time and the electrolyte is contacted with the substrate (or the under layer) resulting in an electrolyte decomposition. Even if the anodic oxidation is terminated immediately before the state shown in FIG. 3A, depths of respective nano holes may be deviated to some degree. Accordingly, it is difficult to produce the structure having a uniform barrier layer remained over a wide range as shown in FIG. 3A.

The structure with the barrier layer remained as shown in FIG. 3A may realize in a part of the substrate. In this case, when the barrier layer is then removed, the diameters of the nano holes near the removed part lack linearity and become discontinuous as shown in FIG. 3B, and the shapes of the nano holes are largely different.

In particular, if the nano holes are deep, thicknesses and a proceeding degree of the anodic oxidation become easily deviated. It is difficult to give the barrier layer with the uniform thickness, and it is almost impossible to remove the barrier layer by the dry etching and the like.

There is no description about the production of the anodically oxidized alumina nano holes using noble metal and carbon as the under layer. It is contemplated that if the under layer is made of these low reactive materials, water is started to be electrolyzed once the under layer is anodically oxidized and foams are produced, which breaks the anodically oxidized film.

One object of the present invention is to provide a structure having holes penetrating to the predetermined depth area. Other object of the present invention is to provide a nano structure having nano holes with excellent linearity and diameter uniformity where bottoms of the nano holes are penetrated to an under conductive metal layer, and a method for producing a nano structure to form the anodically oxidized alumina nano holes uniformly and stably.

Still other object of the present invention is to provide a nano structure and a production method therefor providing excellent tightness between an alumina nano hole layer and the substrate, or between the alumina nano hole layer and the under metal layer when the alumina nano hole layer is provided on the substrate via the under metal layer. The nano structure of the present invention has excellent tightness and therefore is preferable especially when a polishing step is conducted after the nano hole production, or when a stress is applied upon the use of the structure.

SUMMARY OF THE INVENTION

According to the present invention, a structure having a hole, including a substrate, a first layer including an alumina hole, and a second layer disposed between the substrate and the fist layer, wherein the second layer contains silicon, and has a smaller hole than the alumina hole. A third layer having conductivity may be formed between the substrate and the second layer. A functional material may be filled into the alumina hole.

A first aspect of the present invention is a nano structure. The nano structure includes an anodically oxidized alumina nano hole layer on a substrate formed by an anodic oxidation method, wherein an under layer is formed at a bottom of the anodically oxidized alumina nano hole layer via an adhesive layer having a pore, wherein a nano hole of the anodically oxidized alumina nano hole layer is penetrated to the under layer through the pore, and wherein the adhesive layer having the pore contains Si as a main component.

In the nano structure, the adhesive layer contains preferably Si and Al as main components, and more preferably is an oxide containing Si and Al. Also, an average diameter (hereinafter also referred to as "diameter") of the pore in the adhesive layer is preferably not less than 1 nm to not more than 9 nm, and the adhesive layer preferably has a thickness of 1 to 50 nm.

Depending on the applications, the under layer is preferably conductive and contains noble metal. Preferably, the nano structure includes an enclosing material embedded into a part or all of the nano hole in the anodically oxidized alumina nano hole layer.

A second aspect of the present invention is a method for producing a nano structure having at least an under layer and an anodically oxidized alumina nano hole layer on a substrate, wherein a nano hole of the anodically oxidized alumina nano hole layer is penetrated to the under layer, comprising the steps of sequentially laminating an under layer, an AlSi layer for an adhesive layer, and an Al layer on at least a substrate to form a laminated film, and anodic oxidizing the laminated film to form the anodically oxidized alumina nano hole layer.

In the method for producing the nano structure, the step of forming the AlSi layer for the adhesive layer preferably comprises the step of forming an AlSi layer containing 20 to 70 atomic % of Si using a film forming technique in which a substance is formed under the condition that Al and Si are in a non-equilibrium state.

Preferably, the step of anodic oxidizing is conducted using an electrolyte containing sulfuric acid. Also, the production method further comprises a step of etching a part of the AlSi layer for the adhesive layer, and the etching step is especially preferably a wet etching step utilizing an acid or an alkali solution. An annealing step is preferably conducted before or after the etching step.

In the method for producing the nano structure, it is useful for practical applications to include the step of embedding an enclosing material into the nano hole after the etching step. The enclosing material embedding step is preferably an electroplating step.

Features of the present invention will be described below.

The nano structure of the present invention is a laminated structure including a substrate/an under layer/an adhesive layer/an anodically oxidized alumina nano hole layer. The anodically oxidized alumina hole is produced by anodic oxidizing a layer containing Al as a main component to oxidize across a total film thickness from a surface to an interface of the adhesive layer, terminating the anodic oxidation at an adequate time, and then etching it. The pores are formed in the AlSi layer for the adhesive layer after the etching step. The bottom of the nano hole is penetrated to the under layer through the pores of the adhesive layer. The nano hole has good linearity to the interface of the adhesive layer.

The present inventors found that a suitable adhesive layer is disposed at the interface between the anodically oxidized alumina nano hole layer and the under layer at the penetrated part of the bottom of the nano hole, whereby the adhesion strength and the tightness between the anodically oxidized alumina nano hole layer and the under layer are increased.

In the nano holes according to the present invention shown in FIGS. 1A and 1B, the nano holes have excellent linearity and diameter uniformity, and the adhesion strength and the tightness between the anodically oxidized alumina nano hole layer and the under layer are excellent, as compared with the conventional nano holes that are subjected to the anodic oxidation step and the barrier layer removing step.

The nano structure of the present invention having excellent adhesion properties and tightness between the anodically oxidized alumina nano hole layer and the under layer is useful when a stress applying step, i.e., a polishing step is conducted, or a stress is applied upon the use of the structure. Since the nano structure of the present invention has excellent adhesion properties, it is relatively stable even if a heat treatment such as an annealing step is conducted. In other words, the nano structure of the present invention has excellent heat resistance, and therefore can be processed at high temperature in the subsequent steps. The heat treatment can improve chemical stability of the anodically oxidized alumina nano hole.

There are potentials to develop novel electronic devices by embedding a metal, a semiconductor, an oxide and the like into the anodically oxidized nano holes of the nano structure according to the present invention.

The anodically oxidized nano holes of the nano structure according to the present invention can be applied to a wide variety of forms including a quantum fine lines, a MIM element, an electrochemical sensor, coloring, a magnetic recording medium, an EL light emitting element, an electrochromic element, an optical element, an abrasion resistant and insulation resistant coat, and a filter. Thus, its applications can be significantly broaden.

Further objects, features and advantages of the present invention will become apparent from the following description of the preferred embodiments (with reference to the attached drawings).

DESCRIPTION OF THE PREFERRED EMBODIMENTS

<Nano Structure Construction>

Referring to Figures, the nano structure of the present invention will be described.

Figure 1A:
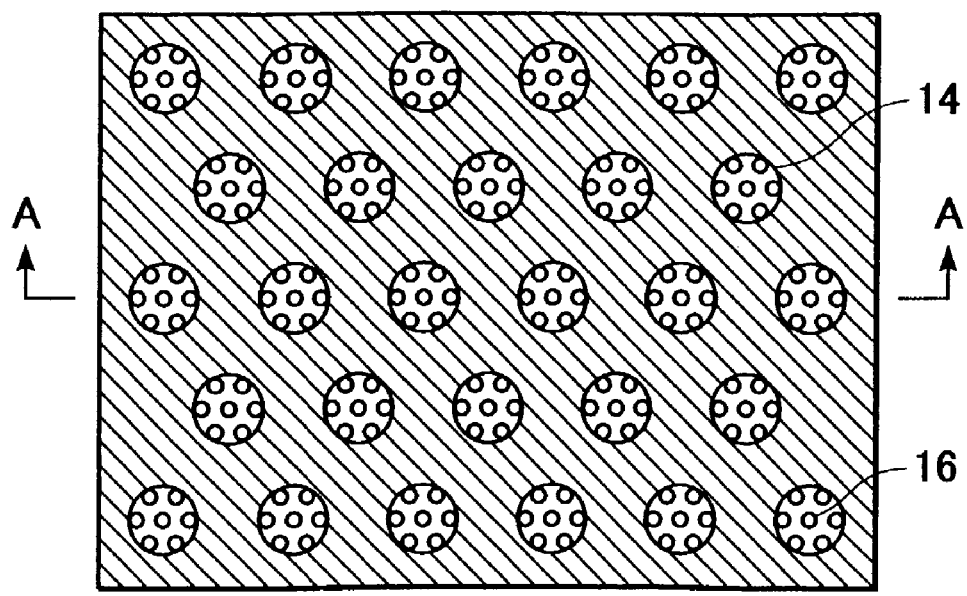
FIGS. 1A and 1B are conceptual views showing a nano structure according to the present invention.
Figure 1B:
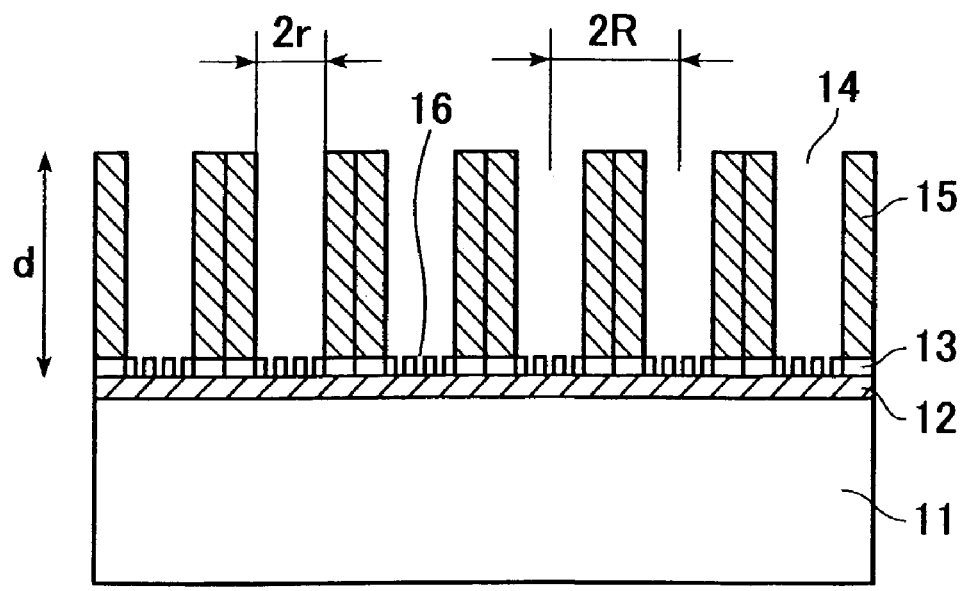
Figure 2A:
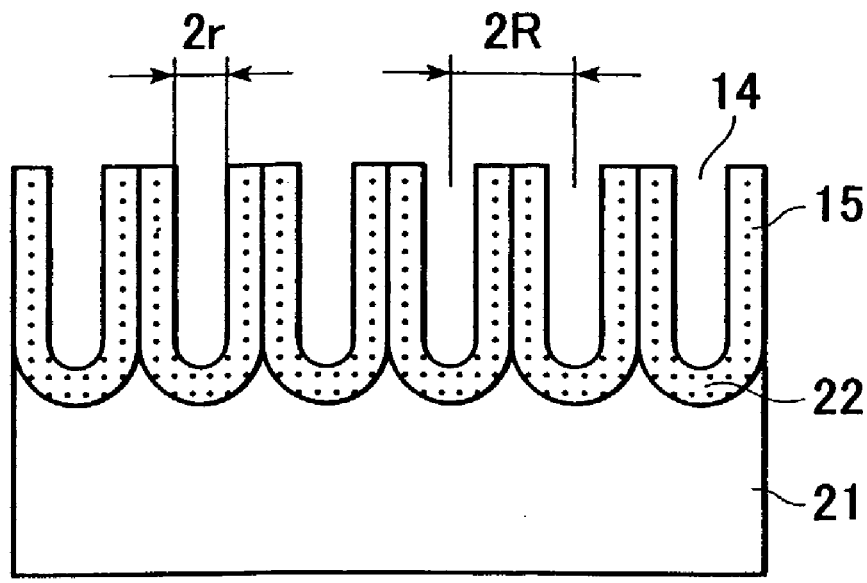
FIGS. 2A and 2B are conceptual views showing conventional anodically oxidized alumina nano holes on an Al plate (film).
Figure 2B:
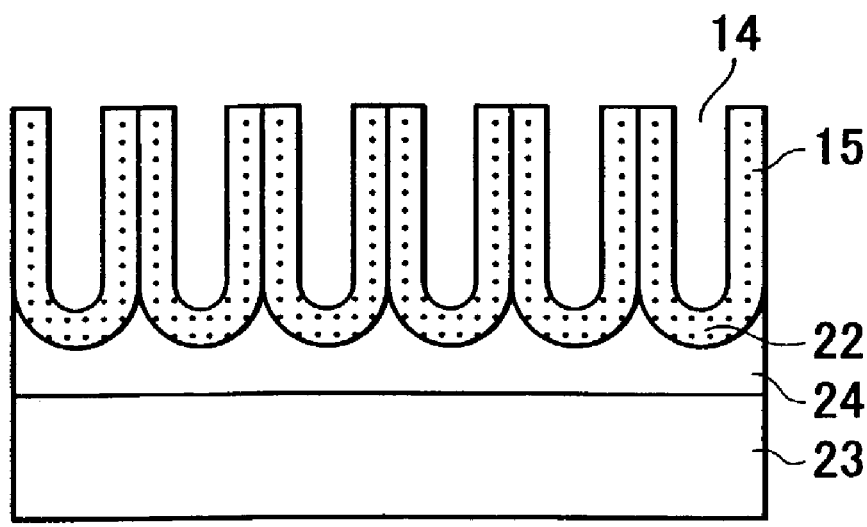
Figure 3A:
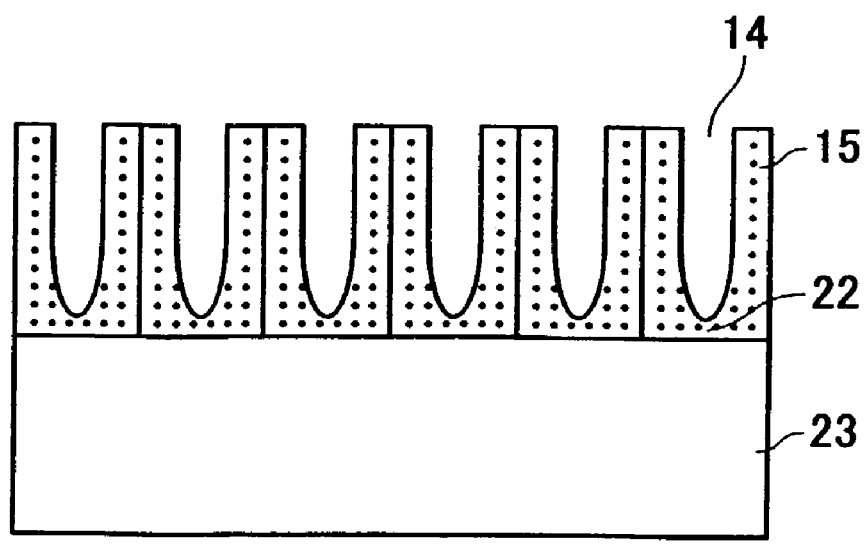
FIGS. 3A and 3B are conceptual views showing conventional anodically oxidized alumina nano holes on an Al plate (film).
Figure 3B:
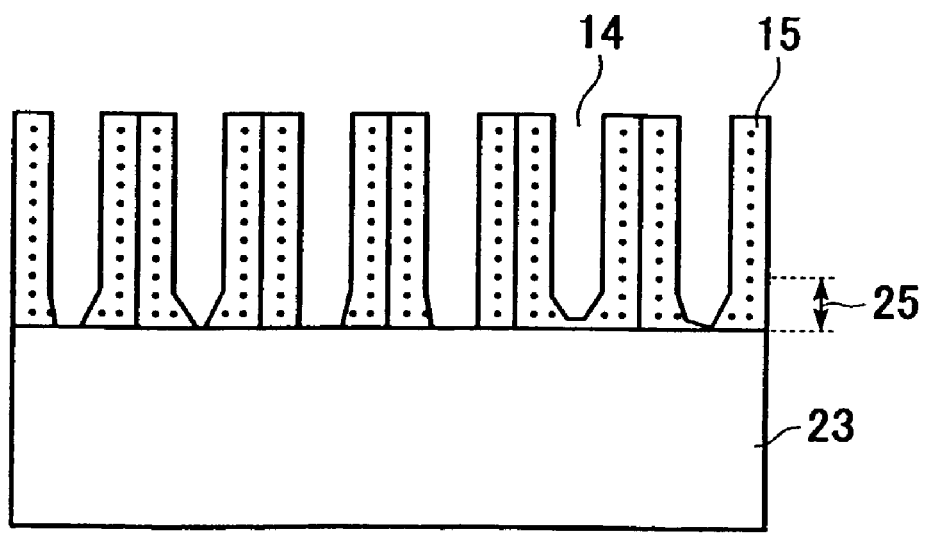

FIGS. 1A and 1B are conceptual views showing the nano structure of the present invention. FIG. 1A shows a plane view, and FIG. 1B shows a sectional view along the line A—A. The nano structure shown in FIGS. 1A and 1B includes a substrate 11, an under layer 12 including a conductive metal, an adhesive layer 13, nano holes 14, an anodically oxidized alumina nano hole layer 15 (also referred to as "anodically oxidized film"), and pores 16 disposed in the adhesive layer.

The anodically oxidized film 15 contains Al and oxygen as main components, includes a number of columnar nano holes 14 shown in FIGS. 1A and 1B. The nano holes 14 are disposed substantially vertical to a surface of the under layer, and are located in parallel each other at substantially equal spaces. Also, the nano holes 14 are prone to be arranged in a triangular lattice as shown in FIG. 1A. Each of the nano holes has a diameter $2r$ of several nm to several hundreds nm, and a space $2R$ of about several tens of nm to several hundreds nm.

When the nano holes are arranged in a honey-bomb structure, uniformity of shapes of the nano hole diameters and uniformity of the penetration to the bottoms of the nano holes are improved. The nano holes can be thus arranged by producing convex and concave portions on the Al surface at an adequate space, and by staring the production of the nano holes at the concave portions. The convex and concave portions are produced by forming concaves on the Al surface or locating a member having convexes and concaves on the aluminum surface.

The spaces and the diameters of the nano holes can be significantly controlled by process conditions such as a concentration and a temperature of the electrolyte for use in the anodic oxidation, a method for changing an anodic oxidation voltage, a voltage value, a time, and subsequent etching conditions for widening the pores.

A thickness and a depth of the anodically oxidized alumina nano hole layer can be controlled by a thickness of a film containing Al as a main component, and are 10 nm to 100 $\mu$m, for example. Conventionally, the depth of the nano hole is controlled by the duration of the anodic oxidation. According to the present invention, the depth of the nano hole can be controlled by the thickness of the film containing Al as the main component to provide the anodically oxidized alumina nano holes with the uniform depth.

The anodically oxidized nano hole layer is preferably made of an oxide of Al, but may contain other elements as long as the nano hole can be successfully formed.

The adhesive layer 13 is a film containing Si as a main component with finer pores than the nano holes. The adhesive layer is obtained from the AlSi layer preferably represented by the formula $Al_{1-x}Si_x$ where $x=0.2$ to 0.7 before the anodic oxidation. In other words, the AlSi layer contains 20 to 70 atomic % of Si based on the total amounts of Al and Si. After the anodic oxidation or the etching, Al is dissolved, which leads to a tendency that Si becomes the main component as compared with the above-defined composition. It is more preferable that the AlSi layer contain 30 to 60 atomic %. Alternatively, a mixture of Si and Ge can be used instead of Si.

The AlSi layer is formed by sputtering Al and Si at the above-defined composition ratio. Suitable composition segregation is induced in the AlSi surface, whereby Al columnar structures are formed and dispersed in areas containing Si as the main component. The diameter of the Al columnar structure is about several nm. The Al columnar structures are disposed at a space of about 3 to 10 nm. The diameter and the space of the Al columnar structure depend on the film forming conditions and the composition ratio of Al and Si. Thus obtained layer is subjected to the anodic oxidation and the etching steps to dissolve the Al columnar structures, thereby forming the pores 16. When the adhesive layer is subjected to sufficient anodic oxidation, the parts containing Si as the main component are also oxidized to form the adhesive layer containing oxidized Si as the main component. When the adhesive layer is subjected to suppressed anodic oxidation and etching, the adhesive layer containing amorphous Si is formed. The pores are preferentially formed in the adhesive layer under the parts where the alumina nano holes are present. The thickness of the adhesive layer is not especially limited, but generally 0.3 nm to 100 nm, and more preferably about 1 nm to 50 nm.

When the adhesive layer including the pores contains Si as the main component, it contains 80 to 100 atomic %, preferably 90 to 100 atomic % of Si. The adhesive layer may contains 0 to 20 atomic %, preferably 1 to 10 atomic % of Al.

When the adhesive layer including the pores contains Si and Al, it contains 80 to 100 atomic %, preferably 90 to 100 atomic % of Si based on the total components other than oxygen. The adhesive layer may contains 0 to 20 atomic %, preferably 1 to 10 atomic % of Al.

The under layer 12 is not especially limited, but is preferably flat. When the under layer is used as an electrode, it preferably contains a conductive material. Specific examples include noble metals such as Ag, Au, Pt, Pd, Ir, Rh, Os, Ru, and their alloys or Cu, graphite, and semiconductors such as Si, InP and Ge. The under layer may be a thin film or the substrate itself. If the enclosing material is embedded into the nano holes by electrodeposition, the under layer preferably contains the noble metal. The nano structure of the present invention has an advantage that the filling material and the under layer are well electrically connected.

Figure 5A:
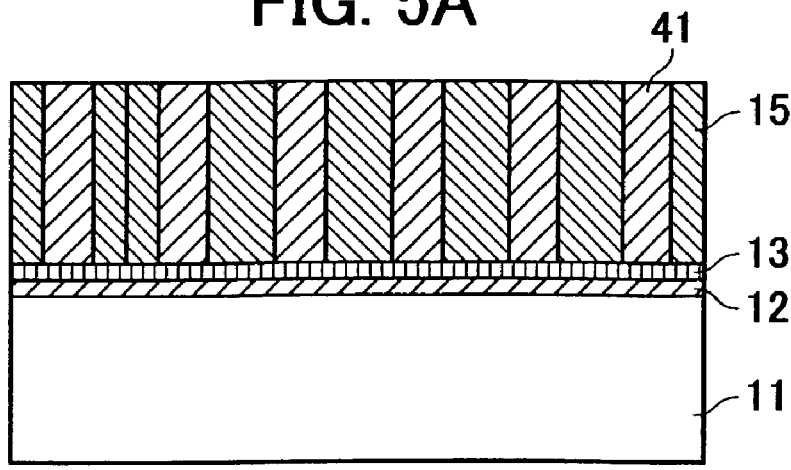
FIGS. 5A to 5C are conceptual views showing embedding an enclosing material into anodically oxidized alumina nano holes of a nano structure according to the present invention.
Figure 5B:
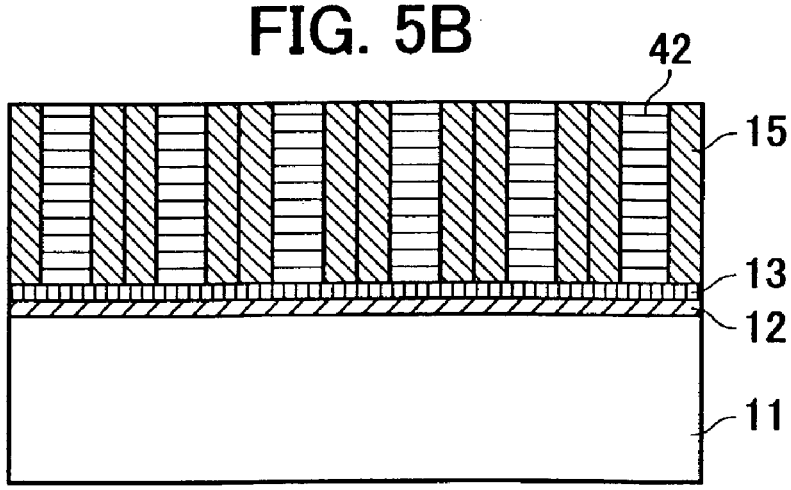
Figure 5C:
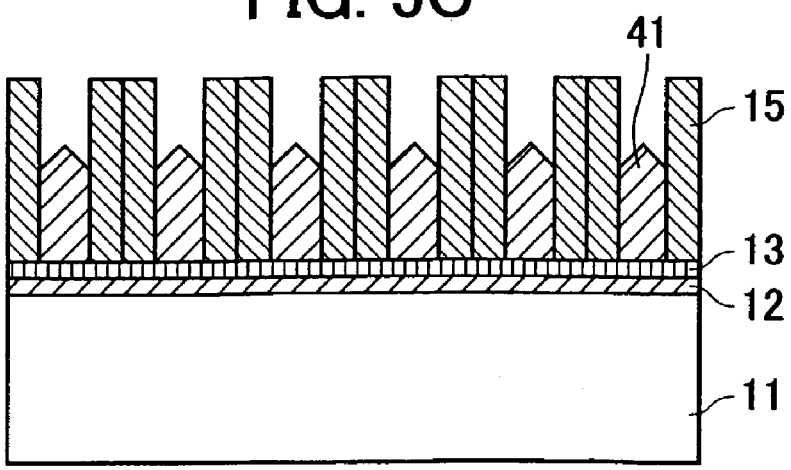
Figure 6A:
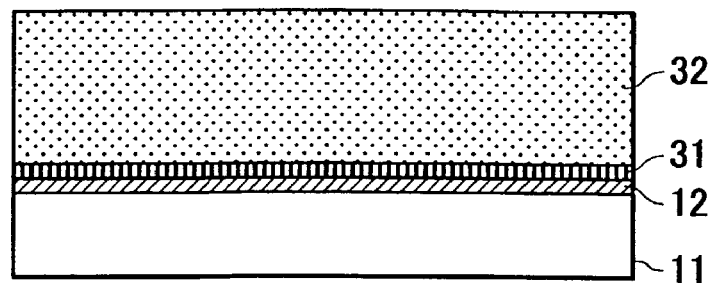
FIGS. 6A to 6D are conceptual views showing steps of a method for producing a nano structure according to the present invention.
Figure 6B:
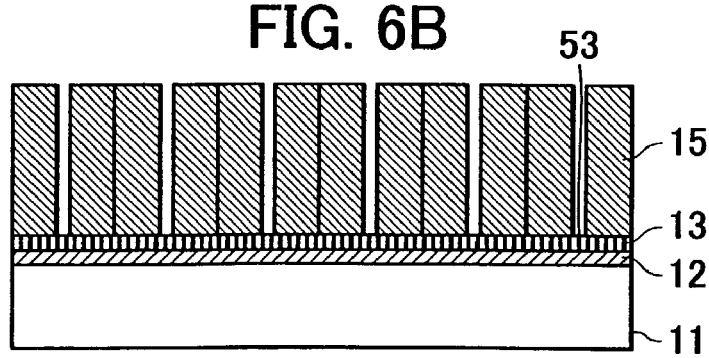
Figure 6C:
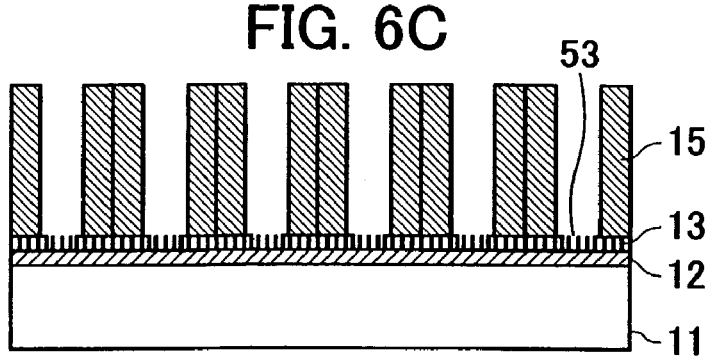
Figure 6D:
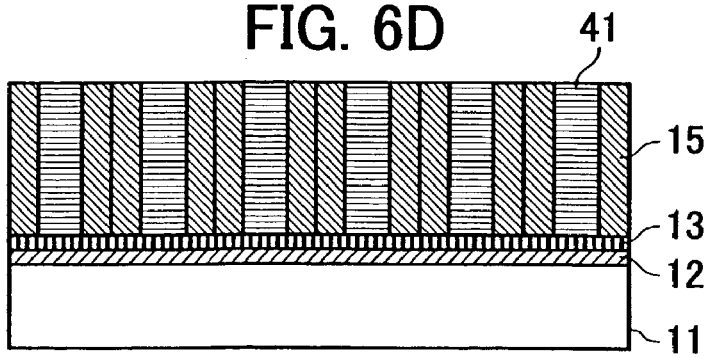

Examples of the constructions of the nano structure into which the enclosing material is embedded are shown in FIGS. 5A to 5C. In FIG. 5A, the enclosing material 41 is uniformly embedded into the nano holes up to the surfaces of the nano holes. In FIG. 5B, a laminated film made of the enclosing material 42 is embedded into the nano holes. In FIG. 5C, the enclosing material 41 is embedded into the nano holes such that the nano holes are not completely filled. The enclosing material extending to outside of the nano holes may be embedded into the nano holes (not shown).

If the enclosing material is magnetic, the nano structure may be used as a vertical magnetization film of a magnetic medium, or as a fine line of a quantum effect device. If Co and Cu are laminated and electrodeposited within the nano holes as shown in FIG. 5B, a GMR element in response to a magnetic field can be fabricated. If the enclosing material is embedded into the nano holes such that the nano holes are not completely filled as shown in FIG. 5C, an electron emitting device can be fabricated.

If the enclosing material is a light emitting material or a phosphor, the nano structure can be used as a wavelength changing layer as well as the light emitting device. If a dielectric material other than alumina is embedded into the enclosing material, the nano structure is effective as a photonic device.

In the present invention, the enclosing material may not only be present within the anodically oxidized alumina nano holes, but also extend to outside of the holes. The anodically oxidized alumina nano hole structure according to the present invention can be used as a mask or a mold.

<Production of the Nano Structure>

Figure 4:
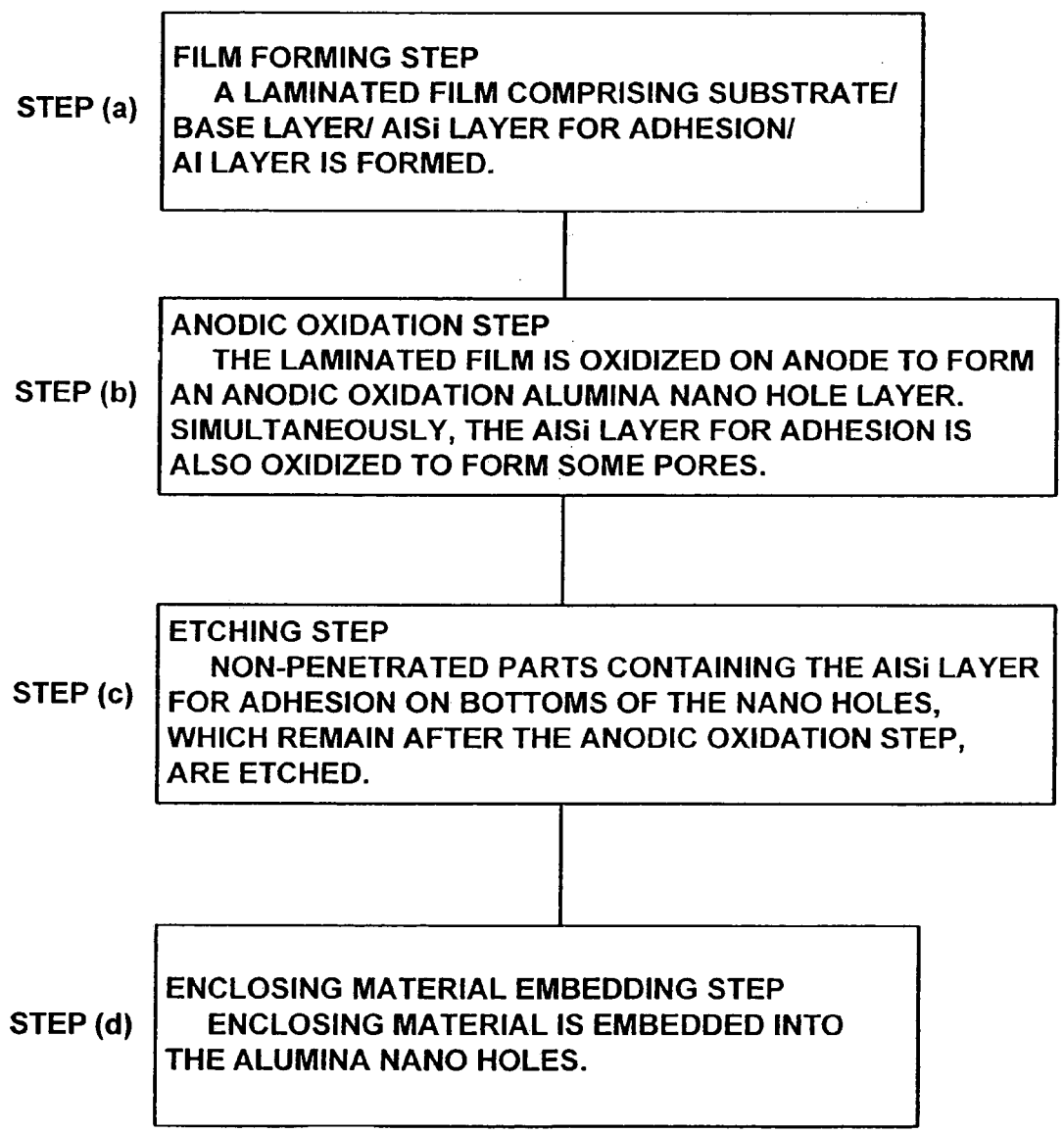
FIG. 4 is a process chart showing one embodiment of a method for producing a nano structure according to the present invention.

Referring to Figures, a method for producing the nano structure according to the present invention will be described. FIG. 4 is a process chart showing one embodiment of a method for producing a nano structure according to the present invention. In FIG. 4, the method for producing a silicon nano structure of the present invention comprises the steps (a) to (d).

Step (a): Film Forming Step

A film forming step comprises the steps (a-1) to (a-3) to from a laminated film including an under layer/an AlSi layer for an adhesive layer/an Al layer on a substrate.

Step (a-1): The under layer is formed on the substrate.
Step (a-2): The AlSi layer for the adhesive layer is formed on the under layer of the substrate using a film forming technique in which a substance is formed under the condition that Al and Si are in a non-equilibrium state. Thus-obtained AlSi layer for the adhesive layer has columnar structures containing Al as a main component, and Si areas surrounding the columnar structures, and includes a mixed film containing 20 to 70 atomic % of Si based on the total amounts of Al and Si.

Step (a-3): Then, an Al film is formed on the AlSi layer for the adhesive layer.

The film forming method in the above-described steps (a-1) to (a-3) may be any methods including resistance heating vapor deposition, EB vapor deposition, sputtering, and CVD. In any case, the surface of the Al film is preferably flat.

Step (b): Anodic Oxidation Step

Then, the laminated film obtained in the step (a) is anodically oxidized to form an anodically oxidized alumina nano hole layer. The Al film is anodically oxidized to form the alumina nano holes. By the anodic oxidation, the Al columnar structures in the AlSi layer for the adhesive layer are oxidized and dissolved to form the pores. Simultaneously, Si parts of the AlSi layer for the adhesive layer are also oxidized.

Step (c): Etching Step

Non-penetrated parts containing the AlSi layer for the adhesive layer on bottoms of the nano holes, which remain after the anodic oxidation step, are etched to form the pores in the AlSi layer for the adhesive layer. Also, the diameter of the nano hole is broaden.

Step (d): Enclosing Material Embedding Step

After the etching step, the enclosing material is embedded into the alumina nano holes.

Figure 7:
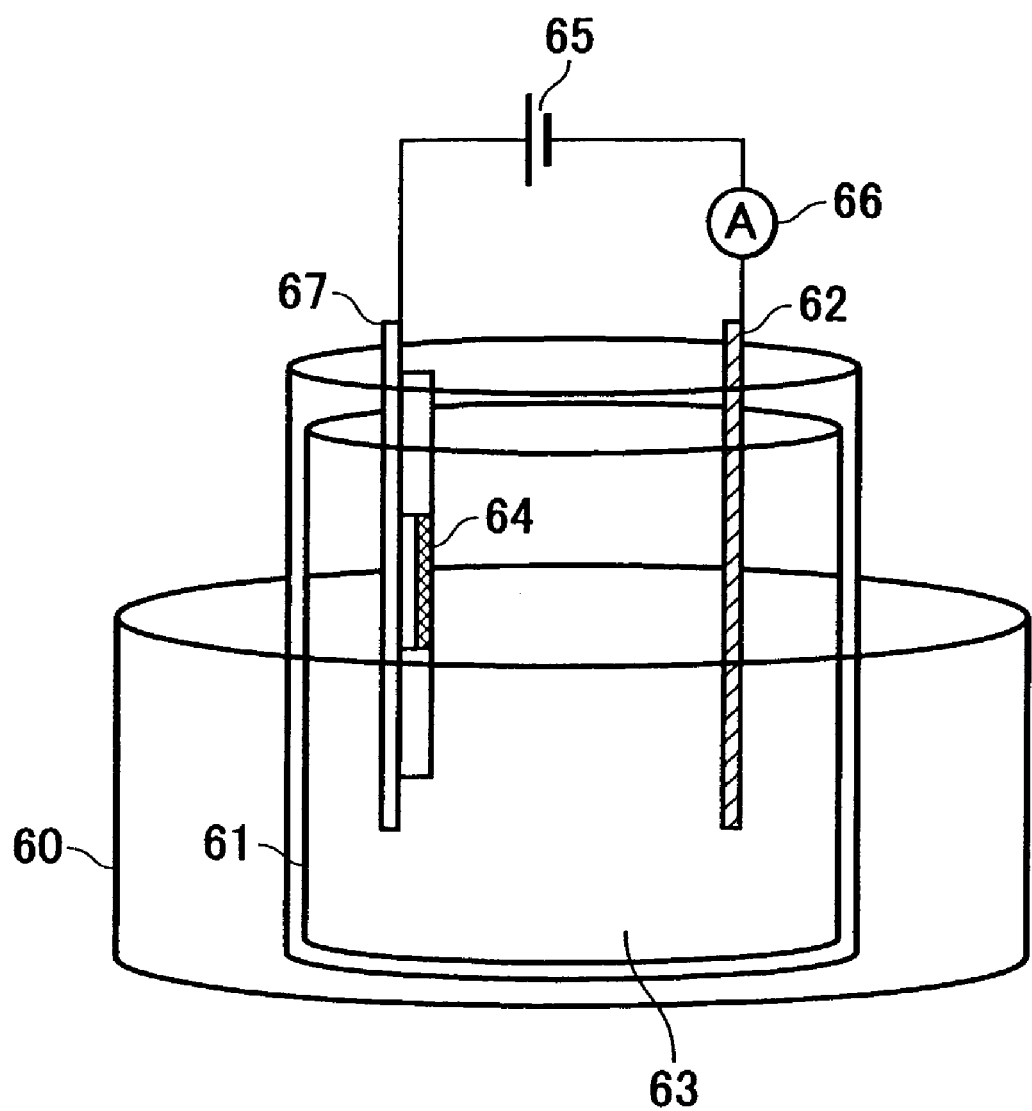
FIG. 7 is a schematic view showing an anodic oxidation apparatus.

Referring to FIGS. 6 to 9, a method for producing the nano structure of the present invention will be described. FIGS. 6A to 6D are conceptual views showing steps of the method for producing the nano structure according to the present invention. FIG. 6A is a sectional view showing a film structure before the anodic oxidation. On a substrate 11, an under layer 12, an AlSi layer for an adhesive layer 31, a film containing Al as a main component 32 are sequentially formed. FIG. 6B is a sectional view showing the film structure after the anodic oxidation. An adhesive layer 13 may have pores 53 or Al columnar structure(s) may remain in the adhesive layer 13. FIG. 6C is a sectional view showing that Al parts remained on the adhesive layer are dissolved after the etching, and the diameters of the nano holes are broaden. FIG. 6D is a sectional view showing the nano holes filled with the enclosing material 41 such as a metal and a semiconductor. FIG. 7 is a schematic view showing an anodic oxidation apparatus for use in the present steps.

The steps of FIGS. 6A to 6D will be described for detail. The following steps (a) to (d) correspond to the steps of FIGS. 6A to 6D.

(a) Film Forming Step

A sample is produced by forming the under layer 12, the AlSi layer for the adhesive layer 31 and the Al film 32 on the substrate 11. The film forming method may be any methods including resistance heating vapor deposition, EB vapor deposition, sputtering, and CVD. In any case, the surface of the Al film is preferably flat.

According to the present invention, the step of forming the AlSi layer for the adhesive layer has characteristics, which will be described below.

The AlSi layer for the adhesive layer 31 is formed on the under layer 12 of the substrate 11 using the film forming technique in which the substance is formed under the condition that Al and Si are in a non-equilibrium state. As the film forming technique in which the substance is formed under the non-equilibrium state, the sputtering is used as one example.

Figure 11:
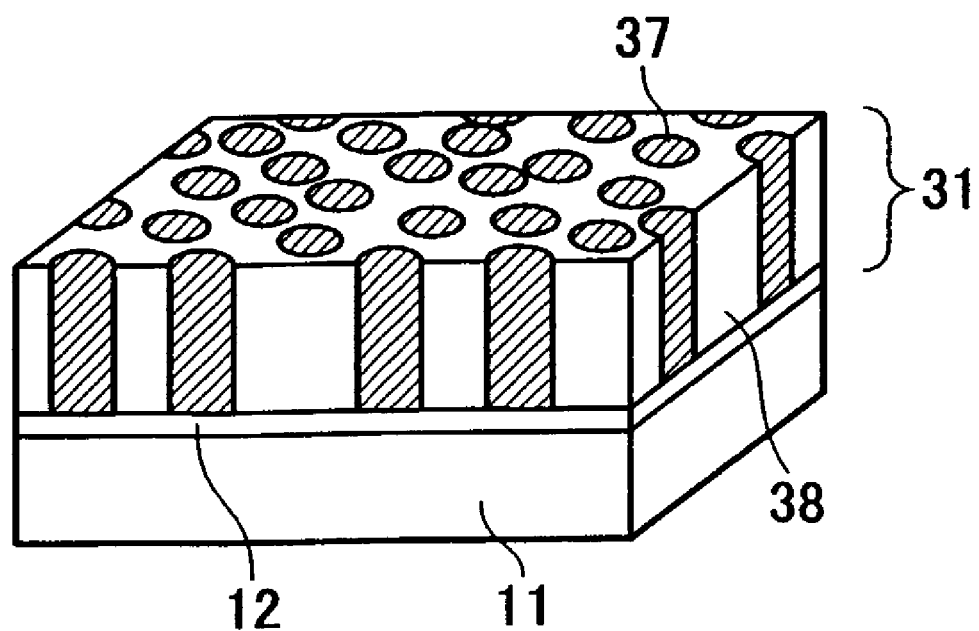
FIG. 11 is a conceptual view showing an AlSi layer for an adhesive layer according to the present invention.

On the under layer 12, the AlSi layer for the adhesive layer 31 is formed by a magnetron sputtering method that is the film forming technique in which the substance is formed under the non-equilibrium state. The AlSi layer for the adhesive layer 31 is constituted of Al columnar structures 37 containing Al as a main component, and Si areas 38 containing Si as a main component therearound as shown in FIG. 11.

Figure 10:
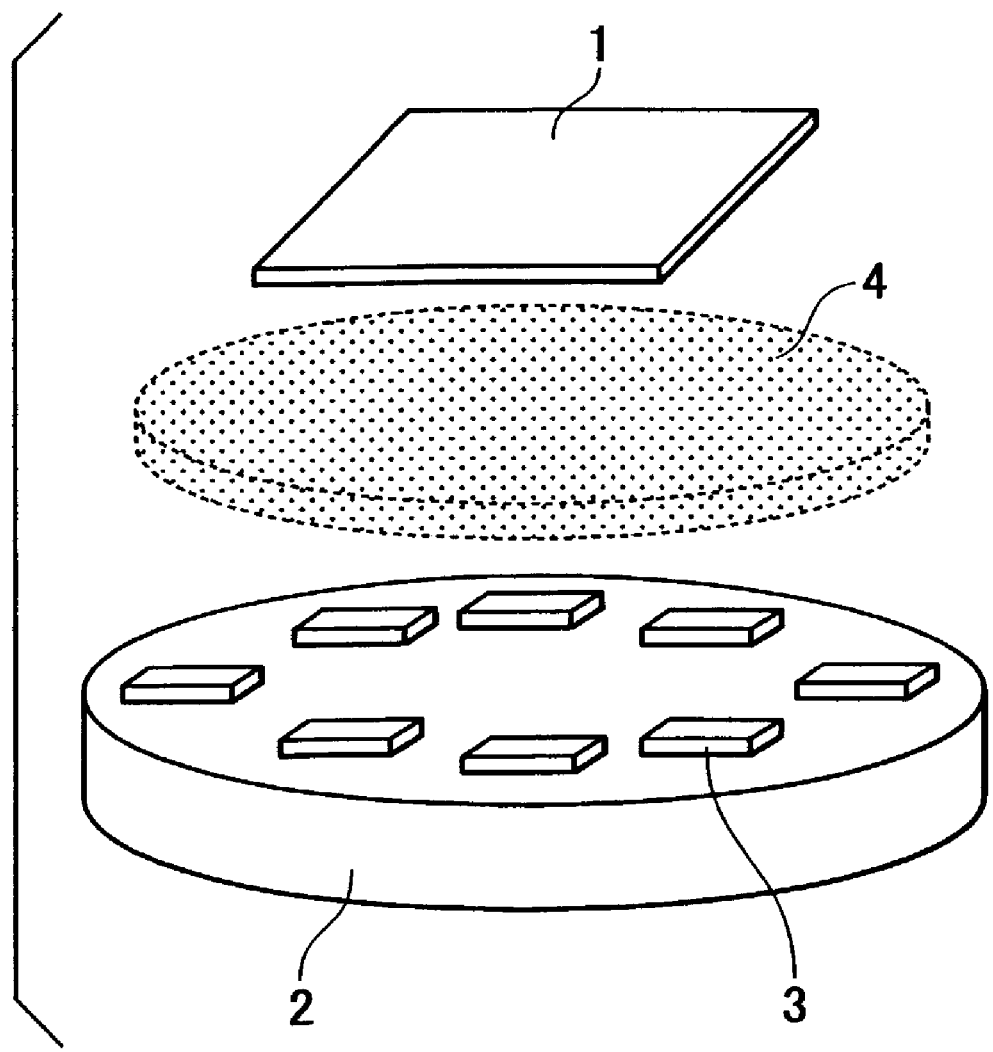
FIG. 10 is a schematic view showing an example of a method for forming an AlSi layer for an adhesive layer according to the present invention.

Referring to FIG. 10, there will be described a method for forming the AlSi layer for the adhesive layer using a sputtering method as the film forming method under the non-equilibrium state. FIG. 10 shows a substrate 1 and a sputtering target 2. With the sputtering method, a concentration or composition of Al and Si can be easily changed. As shown in FIG. 10, the AlSi layer for the adhesive layer is formed by the magnetron sputtering method that is the film forming technique in which the substance is formed under the non-equilibrium state. The substrate 1 is equal to the substrate 11 including the under layer 12.

As shown in FIG. 10, Si and Al sources are fed by disposing Si chips on an Al target (substrate) 2. Although the Si chips 3 are disposed apart in FIG. 10, it is not limited thereto, and single Si chip may be used, as long as the film can be formed as desired. However, in order to disperse the columnar structures containing Al uniformly within the Si areas, the Si chips are preferably disposed symmetry on the substrate 1.

Also, an AlSi sintered product produced by sintering the predetermined amount of Al powder and Si powder can be used as a target material for the film forming. Alternatively, the Al target and the Si target are prepared separately, and sputtering may be performed using both targets simultaneously.

The AlSi layer contains 20 to 70 atomic %, preferably 25 to 65 atomic %, more preferably 30 to 60 atomic % of Si based on the total amounts of Al and Si. When the amount of Si is within the range, there is provided the AlSi layer for the adhesive layer in which the Al columnar structures are dispersed in the Si areas.

The "atomic %" represents the ratio of Al or Si to the sum of Al and Si, and is also described as atom % or at %. It is obtained by a quantitative analysis of the amounts of Si and Al in the AlSi layer for the adhesive layer using, for example, an inductively coupled plasma emission spectrometry.

Although the concentration is herein represented by the atomic %, it can be represented by wt %. That is, not less than 20 atomic % to 70% or less of Si is equal to not less than 20.65 wt % to 70.84 wt % or less. (Conversion of atomic % to wt % is as follows: A weight ratio of Al to Si is determined using an Al atomic weight of 26.982 and a Si atomic weight of 28.086. A value obtained from (weight ratio)×(atomic %) can be converted into wt %.)

The substrate has a temperature of 300° C. or less, preferably 200° C. or less. The substrate may have a temperature of not less than 0° C. to 100° C. or less, only if the AlSi layer can be formed. In such a way, the AlSi layer for the adhesive layer is formed, resulting in eutectic crystal morphology where Al and Si are in a metastable state. The Al forms several nm level of nano columnar structures, which are separated self-organizingly. Such structures are in substantially columnar shapes, and have a diameter of 1 to 10 nm and a space of 3 to 15 nm.

The amount of Si in the AlSi layer for the adhesive layer can be controlled by, for example, changing the amount of Si chips disposed on the Al target. When the film is formed under the non-equilibrium state, especially by the sputtering method, a pressure in a reaction vessel where argon gas flows is preferably about 0.2 to 1 Pa. The pressure is not especially limited thereto. Any pressure may be used, as long as argon plasma is formed stably.

The film forming method that the substance is formed under the non-equilibrium state is preferably the sputtering method, but may be any methods including resistance heating vapor deposition, electron beam (EB) vapor deposition.

As the film forming method, there are a simultaneous process in which Si and Al are formed simultaneously, and a lamination process in which some atomic layers of Si and Al are laminated. Thus-formed AlSi layer for the adhesive layer 31 includes the Al columnar structures 37 containing Al as a main component, and the Si areas 38 containing Si as a main component therearound as shown in FIG. 11.

The Al columnar structures 37 containing Al as the main component may contain other elements such as Si, oxygen and argon as long as the columnar microstructures are provided.

The Si areas 38 containing Si as the main component surrounding the Al columnar structures may contain other elements such as Al, oxygen and argon as long as the columnar microstructures are provided.

(b) Anodic Oxidation Step

The sample in which the laminated film is formed on the substrate in the film forming step is subjected to the anodic oxidation to provide the nano hole structure of the present invention. FIG. 7 is a schematic view showing one example of an anodic oxidation apparatus for use in this step.

In FIG. 7, the anodic oxidation apparatus includes a constant temperature bath 60, a reaction vessel 61, a counter electrode 62 such as a Pt plate, an electrolyte 63, a sample 64, a power source 65 for applying an anodic oxidation voltage, an ammeter 66 for measuring an anodic oxidation current, and a sample holder 67. The apparatus further includes a computer that automatically control and measure the voltage and current (not shown). The sample 64 and the counter electrode 62 are disposed in the electrolyte kept at constant temperature by the constant temperature bath. The power source applies the voltage between the sample and the electrode to conduct the anodic oxidation. The holder 67 is for preventing the voltage from applying to undesired parts.

Examples of the electrolyte for use in the anodic oxidation include oxalic acid, phosphoric acid, sulfuric acid and chromic acid solutions. When the voltage is low (about ~30 V), the sulfuric acid solution is preferable. When the voltage is high (60 V~), the phosphoric acid solution is preferable. When the voltage is medium (30 V to 60 V), the oxalic acid solution is preferable. If the Al layer may have a pin hole or pin holes, the electrolyte may be contacted with the under layer to electrolyze water to induce foams, for example, of oxygen. The foams may be dispersed by mixing 3% or more of alcohol such as ethanol and isopropyl alcohol into the electrolyte, whereby the anodic oxidation can be stabilized.

Figure 8:
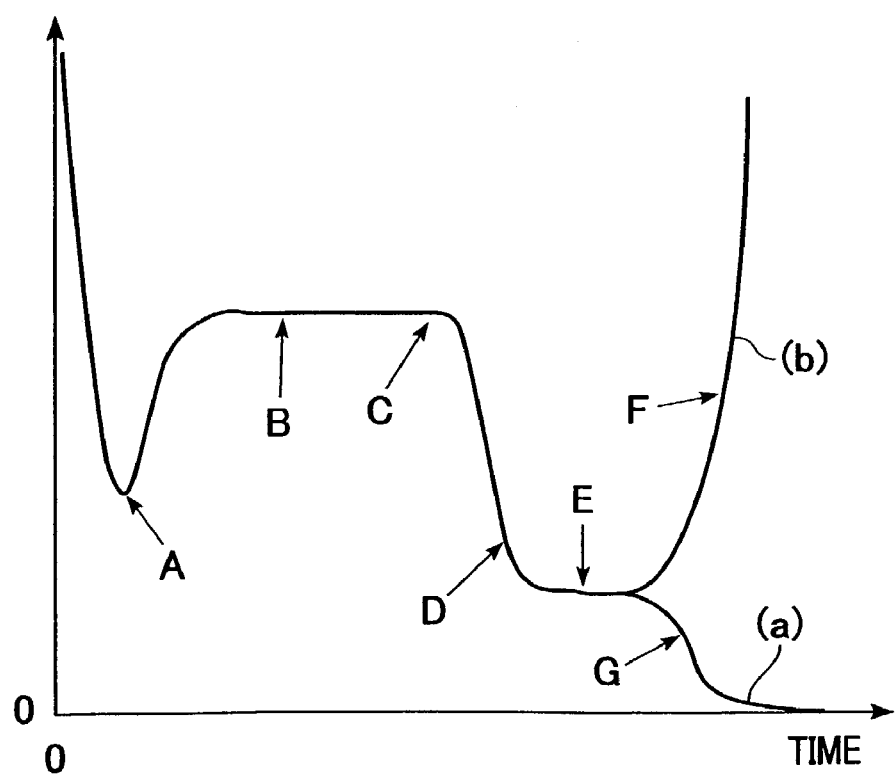
FIG. 8 is a graph showing a current profile upon anodic oxidation.
Figure 9A:
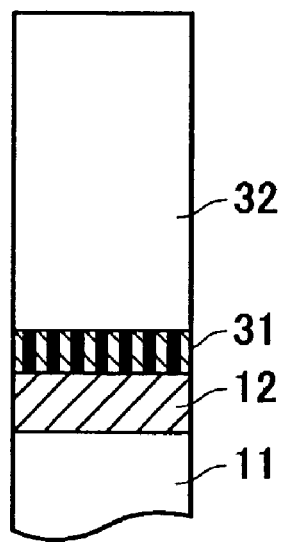
FIGS. 9A to 9D are conceptual views showing anodically oxidized alumina nano hole according to the present invention.
Figure 9B:
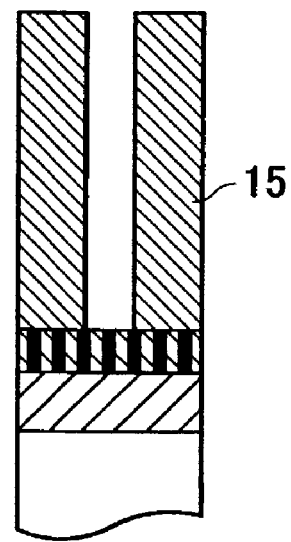
Figure 9C:
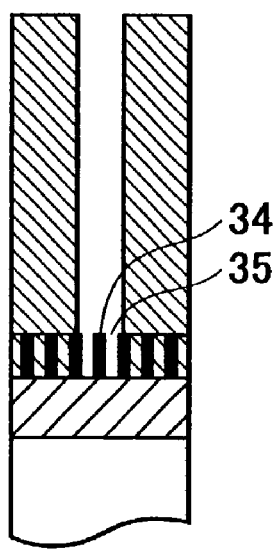
Figure 9D:
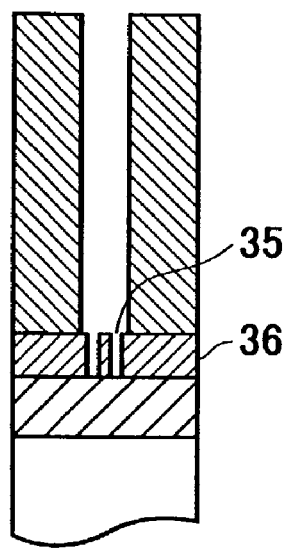

The anodic oxidation will be described. FIG. 8 is a graph showing a current profile upon anodic oxidation using various under metal layers. A sample is made by forming the above-described lamination film on the substrate made, for example, of quarts. The under layer is used as the electrode, and the anodic oxidation is performed at a constant voltage in the electrolyte, i.e., the oxalic acid solution. Initially, the surface of Al is oxidized to rapidly decrease a current value (point A in FIG. 8). Once the nano holes are started to be formed in the Al film, the current gradually increases and become uniform (point B in FIG. 8). In order to measure an accurate oxidation current, it is required not to contact the under layer with the electrolyte. When the AlSi layer for the adhesive layer is subjected to the anodic oxidation (point C in FIG. 8), oxidation of Al and diffusion of Al ions to the electrolyte are inhibited to decrease the current value (point D in FIG. 8). Then, the AlSi layer is started to be anodically oxidized (point E in FIG. 8). At this point, the anodic oxidation of the top of the Al film is terminated as shown in FIG. 9B, the Al columnar structures in the AlSi layer for the adhesive layer are oxidized and dissolved as shown in FIG. 9C, and simultaneously the Si parts in the AlSi layer for the adhesive layer is oxidized as shown in FIG. 9D. If the anodic oxidation proceeds, the surface of the under layer may be contacted with the solution to electrolyze water, thereby increasing the current value (point F in FIG. 8). The electrolysis may gradually break the nano holes. If the oxide in the under metal layer exists stably (Si, Ti, Zr, Hf, Nb, Ta, Mo, W or a combination thereof is mixed therein), the current can be sufficiently decreased (point G in FIG. 8). The termination point of the anodic oxidation is the point E, or the subsequent point G, or F in FIG. 8. However, it is not preferable that the anodic oxidation is conducted at the point G or F for a long time, since the under layer is excessively oxidized, and the nano holes are broken.

In the anodic oxidation step, the laminated film obtained at the above step (a) is anodically oxidized to form the anodically oxidized alumina nano hole layer. The top of the Al film on the laminated film are anodically oxidized to form the alumina nano holes. By the anodic oxidation, the Al columnar structures in the AlSi layer for the adhesive layer are anodically oxidized and dissolved to form some pores, where there remain incomplete pores having non-penetrated part(s). Simultaneously, the Si parts in the AlSi layer for the adhesive layer is oxidized.

(c) Etching

The above-described nano structure is etched, whereby is it possible to remove the non-penetrated part(s) of the bottoms of the nano holes. The etching may include the step of immersing the structure in an acid solution, i.e., a phosphoric acid solution, or in an alkali solution, i.e., a KOH solution. The etching can also broaden the diameters of the nano holes. The nano structure having the desired nano hole diameter can be obtained by controlling an acid concentration, a processing time, a temperature and the like.

(d) Enclosing Material Embedding Step (Electrodeposition Step)

When the metal is electrodeposited in the nano holes, the substrate is immersed in a solution containing ionized metal after the above-described steps, and the voltage is applied to the under layer. One example of the solution is a cobalt sulfate solution. In order to fully produce nuclei upon the electrodeposition, applying voltage AC is effective. When the metal such as Co, Cu and Ni is electrodeposited, it is required to apply a negative voltage to the under layer, since these elements discharge cations in the electrodeposition solution.

In the present invention, the formation of the enclosing material by electrophoresis is also referred to as the electrodeposition. For example, since a DNA is negatively charged in the solution, a positive voltage is applied to the under layer as described above, whereby it is possible to embed the DNA into the nano holes.

Of course, the enclosing material can be disposed by any film forming methods such as penetration from the top of the nano holes or a CVD method other than the electrodeposition. Also by the electrodeposition, the nano holes can be filled not only with the metal but also with any materials such as a semiconductor and an oxide.

In some cases, after the enclosing material is sufficiently electrodeposited in the nano holes, it is more effective to polish the surface of the nano holes in order to be flat.

It is also effective to anneal the nano structure before or after the etching. An annealing temperature is up to 1200° C. Residual water in the film can be removed by annealing at a temperature of 100° C. or more. Crystalinity of the anodically oxidized film can be enhanced by annealing at an increased temperature. When the nano structure is annealed after the enclosing material is filled, the properties or the structure of the enclosing material can be controlled and the tightness can be improved. The annealing can be conducted under vacuum, or reducing atmosphere such as hydrogen and inactive gas. As long as the under layer is not broken, the annealing can be conducted in air or in oxygen.

EXAMPLES

The present invention will be described by the following Examples.

Example 1

This example illustrates the production of penetrated anodically oxidized alumina nano holes as shown in FIGS. 6A to 6D.

a) Formation of under layer, AlSi layer for adhesive layer and Al film

On eight quartz substrates, Ti films were formed in a thickness of 5 nm by an RF sputtering method, and then Pt films were formed in a thickness of 20 nm, respectively. Eight kind of AlSi layers having $Al_{1-x}Si_x$ composition containing 10, 20, 30, 40, 50, 60, 70, and 80 atomic % (hereinafter simply referred to as "%") of Si, i.e., x=10 to 80%, were formed thereon. On a top of each AlSi layer for the adhesive layer, an Al film was formed in a thickness of 200 nm.

A target was made of aluminum in a shape of circle with a diameter of 100 mm on which 2 to 14 silicon chips in a size of 15 mm square are disposed. Sputtering conditions were as follows: RF power source, Ar flow rate: 50 sccm, discharge pressure: 0.7 Pa, RF power: 1 kW. A temperature of each substrate was room temperature (25° C.).

In this example, the target was composed of aluminum having 2 to 14 silicon chips. The numbers of the silicon chips are not limited thereto, and depend on the sputtering conditions such that the composition of the AlSi layer for the adhesive layer contains silicon in the nearly predetermined amount. Alternatively, the target may be composed of silicon having aluminum chips, or may be composed of a sintered silicon and aluminum.

Thus-obtained aluminum silicon mixture films were observed by a field emission scanning electron microscope (FE-SEM). Aluminum columnar structures were disposed two-dimensionally surrounded by silicon areas on the surfaces, viewing from a top of the substrate, as shown in FIG. 11. Each of the aluminum columnar structure had a diameter of 1 to 9 nm. The aluminum columnar structures were observed for their sections by the FE-SEM, have a length of 20 nm, and were independent each other.

b) Anodic oxidation

Using the anodic oxidation apparatus shown in FIG. 7, the anodic oxidation was conducted. In this example, 0.3 mol/L of oxalic acid solution was used as the electrolyte, and the electrolyte was kept at 17° C. with the constant temperature bath. The voltage of the anodic oxidation was DC40V. The under layer of each sample was used as the electrode so that the anodic oxidation proceeded uniformly. During the anodic oxidation step, the current of the anodic oxidation was monitored to detect that the anodic oxidation proceeded on the Al surface and reached the under layer. The anodic oxidation was terminated when the current was increased as shown in FIG. 8, point E. After the anodic oxidation, the sample was washed with distilled water and isopropyl alcohol.

d) Etching

After the anodic oxidation, each sample was etched by immersing it in a 5 wt % phosphoric acid solution for 15 minutes, as needed.

Results

The surface and section of the samples taken were observed by the FE-SEM. As a result, in each sample having the $Al_{1-x}Si_x$ composition where x=20 to 70%, the nano holes were penetrated to the under layer 12 via the adhesive layer as shown in FIG. 1B. Also, in each sample, the AlSi layer for the adhesive layer oxidized having pores with diameters of 2 to 8 nm remained between the anodically oxidized alumina nano hole layer and the under layer.

In the samples having the $Al_{1-x}Si_x$ composition where x=10% and 80%, the shapes of the pores or the penetration of the nano holes were poor.

The sample of the present invention and a sample including no adhesive layer were polished with a diamond slurry by a polisher to about half of the anodically oxidized alumina nano hole layers. The sample of the present invention was not damaged, but the sample including no adhesive layer was damaged such that a part of the anodically oxidized alumina nano hole layer was peeled. This revealed that the sample of the present invention had sufficient adhesion strength. A sample not etched was produced to evaluate as described above. In such sample, the nano holes were penetrated, but some of them were insufficiently penetrated.

Example 2

Samples were prepared using the same procedure described in Example 1, except that each AlSi layer for the adhesive layer had the $Al_{1-x}Si_x$ composition where x=40%, the thickness of each AlSi layer was any of 1 to 100 nm, and the etching was conducted using a KOH solution for 1 to 10 minutes.

The samples were observed by the FE-SEM. In each sample having the adhesive layer with the thickness of 50 nm or less, the nano holes were penetrated to the under layer 12 as shown in FIG. 1B. In each sample having the adhesive layer with the thickness of more than 50 nm, some of the nano holes were not penetrated. In view of the results, it is preferable that the adhesive layer has a thickness of 1 to 50 nm.

Example 3

Two samples were prepared using the same procedure described in Example 1, except that each AlSi layer for the adhesive layer had the $Al_{1-x}Si_x$ composition where x=40%, and the anodic oxidation was terminated at different timings.

Specifically, the anodic oxidation of one sample A was terminated when an anodizing oxidation current reached the point E shown in FIG. 8, and the anodic oxidation of the other sample B was terminated after the anodized oxidation current reached the point E shown in FIG. 8. Then, the samples were etched in 5 wt % of phosphoric acid solution for 20 minutes.

The samples were observed by the FE-SEM. In the sample A, a Si adhesive layer 34 having pores penetrated to the under layer 12 was at the bottom of the anodically oxidized nano hole film as shown in FIG. 9C. In the sample B, an oxidized Si adhesive layer 36 having pores penetrated to the under layer 12 was at the bottom of the anodically oxidized nano hole film as shown in FIG. 9D.

Example 4

Three samples were prepared using the same procedure described in Example 1, except that each AlSi layer for the adhesive layer had the $Al_{1-x}Si_x$ composition where x=40%, the thickness of each AlSi layer was 50 nm, the under layers were $SiO_2$, Ti, and Pt, the anodic oxidation was terminated at the point E in FIG. 8, and the etching was conducted using 5 wt % of phosphoric acid solution for 20 minutes.

The samples were observed by the FE-SEM. In all samples, the Si adhesive layers having pores penetrated to the under layers 12 were at the bottoms of the anodically oxidized nano hole films as shown in FIG. 9C.

Example 5

Three samples were prepared using the same procedure described in Example 4 such that the under layers were $SiO_2$, Ti, and Pt, the anodically oxidized alumina nano holes were produced, and an enclosing material was electrodeposited. The electrodeposition was conducted as follows: the sample was a working electrode, Co was a counter electrode, a plating bath included 5% $CoSO_4.7H_2O$, 2% $H_3BO_3$, a voltage was VDC of −2V, and an electrodeposition time was 20 sec.

The electrodeposited samples were observed for their section by the FE-SEM. In the sample including the under layer made of Pt, the section had the construction shown in FIG. 5A. The columnar nano holes having a diameter of about 40 nm were filled with Co, and were arranged in parallel at spaces of about 100 nm each other. The columnar nano holes reached the adhesive layer, and Co was electrodeposited in the pores in the adhesive layer. However, in the sample including the under layer made of Ti, Co was electroplated only partly. In the sample including the under layer made of $SiO_2$, Co was not electroplated. In view of the results, the under layer made of noble metal has an advantage in the electrodeposition step.

Example 6

Three samples were prepared using the same procedure described in Example 3 except that the anodic oxidation was conducted using A: 0.3 mol/L of sulfuric acid, at 5° C., 25V, B: 0.3 mol/L of oxalic acid, at 15° C., 40V or C: 0.3 mol/L of phosphoric acid, 10° C., 80V.

Among them, the point E in FIG. 8, that was the constant voltage, was evident when the sulfuric acid A was used. All samples were observed by the FE-SEM. As a result, the sample that was subjected to the anodic oxidation using the sulfuric acid A had best adhesion between the bottom of the anodically oxidized alumina nano hole layer and the adhesive layer.

As is apparent from the above-described embodiments, according to the present invention, adhesion between the under layer and the anodically oxidized alumina nano hole layer is enhanced. Accordingly, the anodically oxidized alumina nano holes can have excellent resistance to any steps or uses where a stress is applied such as polishing and annealing, and their applications can be significantly broaden.

Also, according to the present invention, there can be stably produced the anodically oxidized alumina nano holes that are penetrated to an electrode of the under layer made of, for example, noble metal. The enclosing material can be uniformly electrodeposited in the nano holes. Using such nano holes, magnetic mediums, quantum effect devices, optical devices and the like can be produced.

The present invention enables the anodically oxidized alumina nano holes to apply to various forms, and to significantly broaden their applications. The nano structure of the present invention can be used as the functional material itself, and can also be used as an under layer material or a mold of a further novel nano structure.

As described above, the present invention can provide the nano structure in which the bottoms of the nano holes are penetrated to the under layer having excellent tightness between the anodically oxidized alumina nano hole layer and the conductive under layer. Also, the present invention can provide a method for easily producing the above-mentioned silicon nano structure.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A structure having a hole, including:
   a substrate,
   a first layer including at least a first hole, and a second layer disposed between the substrate and the first layer,
   wherein the second layer has a plurality of second holes each having an average diameter of not less than 1 nm and not more than 9 nm, and
   wherein the first hole of the first layer connects to the plurality of second holes of the second layer.

2. A structure according to claim 1, wherein a third layer having conductivity is formed between the substrate and the second layer.

3. A structure according to claim 1, wherein a functional material is filled into the first hole.

4. A structure according to claim 1, wherein the second layer contains Si and Al as main components.

5. A structure according to claim 4, wherein the second layer is an oxide containing Si and Al.

6. A structure according to claim 1, wherein the second layer has a thickness of 1 to 50 nm.

7. A structure according to claim 2, wherein the third layer contains a noble metal.

8. A structure according to claim 1, wherein a material is embedded into a part or all of the first hole in the first layer.

9. A structure according to claim 1, wherein the second layer contains silicon.

* * * * *

UNITED STATES PATENT AND TRADEMARK OFFICE
CERTIFICATE OF CORRECTION

PATENT NO. : 6,972,146 B2
APPLICATION NO. : 10/385570
DATED : December 6, 2005
INVENTOR(S) : Tohru Den et al.

It is certified that error appears in the above-identified patent and that said Letters Patent is hereby corrected as shown below:

ON THE TITLE PAGE ITEM [56] REFERENCES CITED:

Other Documents after R.C. Forneaux, et al., "oxidizd" should read --oxidized--.

ON THE TITLE PAGE ITEM [57] ABSTRACT:

Line 3, "fist" should read --first--.

COLUMN 1:

Line 25, "A method" should read --Methods--; and
Line 58, "includes" should read --include--.

COLUMN 2:

Line 13, "show a" should read --show--; and
Line 40, "broaden." should read --broadened.--.

COLUMN 3:

Line 8, "realize" should read --exist--;
Line 28, "Other" should read --Another--;
Line 34, "other" should read --another--; and
Line 50, "fist layer," should read --first layer,--.

COLUMN 5:

Line 15, "fine lines" should read --of fine lines,--;
Line 21, "broaden." should read --broadened.--; and
Line 51, "nanohole" should read --nanoholes--.

COLUMN 6:

Line 11, "parallel" should read --parallel with--;
Line 17, "honey-bomb" should read --honey-comb--;
Line 22, "staring" should read --starting--; and
Line 66, "thus obtained" should read --The thus obtained--.

UNITED STATES PATENT AND TRADEMARK OFFICE
CERTIFICATE OF CORRECTION

PATENT NO. : 6,972,146 B2
APPLICATION NO. : 10/385570
DATED : December 6, 2005
INVENTOR(S) : Tohru Den et al.

It is certified that error appears in the above-identified patent and that said Letters Patent is hereby corrected as shown below:

COLUMN 7:

Line 15, "contains" should read --contain--; and
Line 20, "contains" should read --contain--.

COLUMN 8:

Line 6, "from" should read --form--;
Line 39, "broaden." should read --broadened.--;
Line 57, "broaden." should read --broadened.--; and
Line 67, "methods" should read --method--.

COLUMN 9:

Line 36, "single" should read --a single--; and
Line 39, "symmetry" should read --symmetrically--.

COLUMN 10:

Line 19, "method that" should read --method in which--;
Line 21, "any" should read --any of several--;
Line 22, "electron" should read --or electron--;
Line 26, "Thus-formed" should read --The thus-formed--;
Line 29, "as a" should read --as a--; and
Line 51, "control" should read --controls-- and
          "measure" should read --measures--.

COLUMN 11:

Line 5, "under metal layers." should read --metal under layers--;
Line 7, "quarts" should read --quartz--;
Line 13, "become" should read --becomes--;
Line 20, "is started to" should read --begins to--;
Line 25, "is oxidized" should read --are oxidized--;
Line 41, "film are" should read --film is--;
Line 47, "is oxidized." should read --are oxidized.--;
Line 49, "whereby is" should read --whereby it--; and
Line 50, "it possible" should read --is possible--.

UNITED STATES PATENT AND TRADEMARK OFFICE
CERTIFICATE OF CORRECTION

PATENT NO. : 6,972,146 B2
APPLICATION NO. : 10/385570
DATED : December 6, 2005
INVENTOR(S) : Tohru Den et al.

It is certified that error appears in the above-identified patent and that said Letters Patent is hereby corrected as shown below:

COLUMN 12:

Line 22, "Crystalinity" should read --Crystallinity--;
Line 47, "Eight kind" should read --Eight kinds--; and
Line 54, "circle" should read --a circle--.

COLUMN 13:

Line 6, "structure" should read --structures--; and
Line 9, "independent" should read --independent of--.

COLUMN 14:

Line 60, "each" should read --between each--.

COLUMN 15:

Line 22, "broaden." should read --broadened.--.

Signed and Sealed this

Fourteenth Day of August, 2007

JON W. DUDAS
*Director of the United States Patent and Trademark Office*